(12) United States Patent
Wu et al.

(10) Patent No.: US 11,342,373 B2
(45) Date of Patent: *May 24, 2022

(54) MANUFACTURING METHOD OF IMAGE SENSING DEVICE

(71) Applicant: TAIWAN SEMICONDUCTOR MANUFACTURING CO., LTD., Hsinchu (TW)

(72) Inventors: Wei-Chuang Wu, Tainan (TW); Ming-Tsong Wang, Taipei (TW); Feng-Chi Hung, Hsinchu County (TW); Ching-Chun Wang, Tainan (TW); Jen-Cheng Liu, Hsinchu County (TW); Dun-Nian Yaung, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 16 days.

This patent is subject to a terminal disclaimer.

(21) Appl. No.: 16/842,909

(22) Filed: Apr. 8, 2020

(65) Prior Publication Data

US 2020/0243580 A1 Jul. 30, 2020

Related U.S. Application Data

(62) Division of application No. 15/591,244, filed on May 10, 2017, now Pat. No. 10,622,394.

(60) Provisional application No. 62/429,102, filed on Dec. 2, 2016.

(51) Int. Cl.
*H01L 27/146* (2006.01)

(52) U.S. Cl.
CPC .... *H01L 27/1463* (2013.01); *H01L 27/14621* (2013.01); *H01L 27/14629* (2013.01); *H01L 27/14636* (2013.01); *H01L 27/14685* (2013.01); *H01L 27/14687* (2013.01)

(58) Field of Classification Search
USPC .................................. 257/432, 435; 258/438
IPC ................. H01L 27/1463, 27/14636, 27/14685, 27/14629, 27/14687, 27/14621
See application file for complete search history.

(56) References Cited

U.S. PATENT DOCUMENTS

| | | | | |
|---|---|---|---|---|
| 9,647,022 B2* | 5/2017 | Hung | ................ | H01L 27/14643 |
| 10,622,394 B2* | 4/2020 | Wu | ................... | H01L 27/1463 |
| 2015/0349001 A1* | 12/2015 | Wang | .................. | H01L 27/1463 257/443 |
| 2016/0343751 A1* | 11/2016 | Sze | .................. | H01L 27/14656 |

* cited by examiner

*Primary Examiner* — Hrayr A Sayadian
(74) *Attorney, Agent, or Firm* — Birch, Stewart, Kolasch & Birch, LLP (57) ABSTRACT

A method for manufacturing an image sensing device includes forming an interconnection layer over a front surface of a semiconductor substrate. A trench is formed to extend from a back surface of the semiconductor substrate. An etch stop layer is formed along the trench. A buffer layer is formed over the etch stop layer. An etch process is performed for etching the buffer layer. The buffer layer and the etch stop layer include different materials.

20 Claims, 12 Drawing Sheets

MANUFACTURING METHOD OF IMAGE SENSING DEVICE

PRIORITY CLAIM AND CROSS-REFERENCE

This application is a divisional application of U.S. patent application Ser. No. 15/591,244, filed May 10, 2017, now U.S. Pat. No. 10,622,394, issued Apr. 14, 2020, which claims priority to U.S. Provisional Application Ser. No. 62/429,102, filed Dec. 2, 2016, both of which are herein incorporated by reference in their entirety.

BACKGROUND

Semiconductor image sensors are used to sense radiation such as light. Complementary metal-oxide-semiconductor (CMOS) image sensors (CIS) and charged coupled device (CCD) sensors are widely used in various applications such as digital camera or mobile phone camera applications. These devices utilize an array of pixels in a substrate, including photodiodes and transistors, to absorb radiation projected toward the substrate and convert the sensed radiation into electrical signals.

A backside-illuminated (BSI) image-sensor device is one type of image-sensor device. The BSI image-sensor device is used for sensing a volume of light projected towards a backside surface of a substrate (which supports the image sensor circuitry of the BSI image-sensor device). The pixel grid is located at a front side of the substrate, and the substrate is thin enough so that light projected towards the backside of the substrate can reach the pixel grid. The BSI image-sensor device provides a high fill factor and reduced destructive interference, as compared to frontside-illuminated (FSI) image-sensor devices. Although existing BSI image-sensor devices and methods of fabricating these BSI image-sensor devices have been generally adequate for their intended purposes, as device scaling down continues, they have not been entirely satisfactory in all respects.

BRIEF DESCRIPTION OF THE DRAWINGS

For a more complete understanding of the present disclosure, and the advantages thereof, reference is now made to the following descriptions taken in conjunction with the accompanying drawings.

DETAILED DESCRIPTION

It is to be understood that the following disclosure provides many different embodiments, or examples, for implementing different features of the disclosure, Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact. In addition, the like elements in various figures and embodiments are identified by the same or similar reference numerals.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides an image sensing device for sensing a volume of light projected towards a back surface of a semiconductor substrate. An etch stop layer is formed in a trench extending from the back surface of the semiconductor device. A buffer layer is formed on the etch stop layer, and then is etched. In particular, an etch selectivity of the buffer layer to the etch stop layer is greater than a predetermined value. The thickness of the buffer layer may be reduced to minimum (e.g. zero), and the length of the optical path is accordingly thin-downed. Therefore, some optical performances are improved.

The image sensing device according to the present disclosure is a backside-illuminated (BSI) image-sensor device. The BSI image-sensor device includes a charge-coupled device (CCD), a complementary metal oxide semiconductor (CMOS) image sensor (CIS), an active-pixel sensor (APS) or a passive-pixel sensor. The image sensing device may include additional circuitry and input/outputs that are provided adjacent to the grid of pixels for providing an operation environment of the pixels and for supporting external communication with the pixels.

Figure 1:
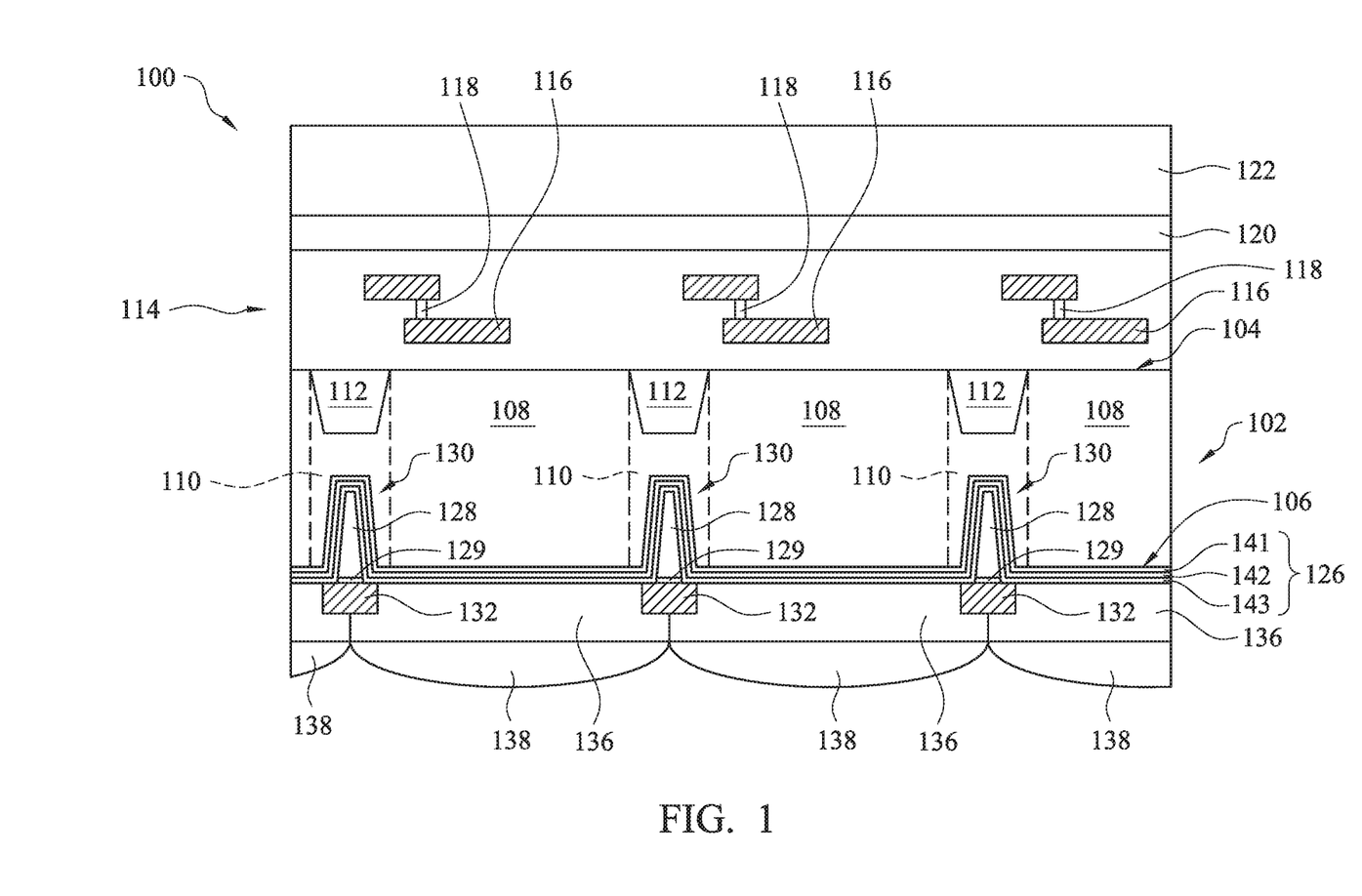
FIG. 1 is a schematic cross-sectional view of a semiconductor device accordance with some embodiments.

FIG. 1 is a schematic cross-sectional view of a semiconductor device accordance with some embodiments. Referring to FIG. 1, the image sensing device 100 includes a semiconductor substrate 102. The semiconductor substrate 102 is a device substrate. The semiconductor substrate 102 may be a silicon substrate doped with a P-type dopant such as boron, in which case the semiconductor substrate 102 is a P-type substrate. Alternatively, the semiconductor substrate 102 could be another suitable semiconductor material. For example, the semiconductor substrate 102 may be a silicon substrate doped with an N-type dopant such as phosphorous or arsenic, in which case the substrate is an N-type substrate. The semiconductor substrate 102 may include other elementary semiconductor materials such as germanium or diamond. The semiconductor substrate 102 may optionally include a compound substrate and/or an alloy semiconductor. Further, the semiconductor substrate 102 may include an epitaxial layer (epi layer), may be strained for performance enhancement, and may include a silicon-on-insulator (SOI) structure.

The semiconductor substrate 102 has a front surface 104 (also referred to as a frontside) and a back surface 106 (also referred to as a backside). For a BSI image sensor device such as the image sensing device 100, incident radiation enters the semiconductor substrate 102 through the back surface 106. In some embodiments, the thickness of the semiconductor substrate 102 is in a range substantially from 1 micrometer to 100 micrometers.

The semiconductor substrate includes radiation-sensing regions 108 and doped isolation regions 110. The radiation-sensing regions 108 are doped with a doping polarity opposite from that of the semiconductor substrate 102. The radiation-sensing regions 108 are disposed adjacent to or near the front surface 104 of the semiconductor substrate 102. Although only a portion of image sensing device 100 is shown in FIG. 1, the image sensing device may further include pinned layer photodiodes, photodiode gates, reset transistors, source follower transistors, and transfer transistors. For the sake of simplicity, detailed structures of the above features are not shown in figures of the present disclosure. The radiation-sensing regions 108 are operable to sense incident radiation that enters the pixel region from the back surface 106. The incident radiation may be visual light. Alternatively, the incident radiation may be infrared (IR), ultraviolet (UV), X-ray, microwave, other suitable types of radiation, or a combination thereof.

The doped isolation regions 110 are adjacent to the radiation-sensing regions 108, in accordance with some embodiments. The doped isolation regions 110 are disposed adjacent to or near the front surface 104. Each pair of neighboring radiation-sensing regions 108 is separated from one another by one of the respective doped isolation regions 110. The doped isolation regions 110 are doped with a doping polarity the same as that of the semiconductor substrate 102. In some embodiments, the doping concentration of the doped isolation regions 110 is higher than that of the semiconductor substrate 102. For example, the doping concentration of the doped isolation regions 110 may be in a range substantially from 1E16 per cm$^3$ to 1E20 per cm$^3$.

Isolation features 112 are disposed in the doped isolation regions 110, in accordance with some embodiments. The isolation features 112 are disposed adjacent to or near the front surface 104 of the semiconductor substrate 102. In some embodiments, the doped isolation regions 110 are aligned with the isolation features 112.

The isolation features 112 include shallow trench isolation (STI) structures and/or local oxidation of silicon (LOCOS) structures. In some embodiments, some active or passive features, such as MOSFET or junction capacitor, are disposed in the radiation-sensing regions 108, according to design needs and manufacturing concerns. The active or passive features in the radiation-sensing regions 108 are surrounded and protected by the isolation features 112. The thickness of the isolation features 112 is greater than that of the active or passive features in the radiation-sensing regions 108. In some embodiments, the thickness of the isolation features 112 is in a range substantially from 100 angstroms to 5000 angstroms. In some embodiments, the isolation features 112 include dielectric material. The dielectric material may include silicon oxide, silicon nitride, silicon oxynitride, a low-k material, or another suitable dielectric material.

An interconnection layer 114 is disposed over the front surface 104 of the semiconductor substrate 102. The interconnection layer 114 includes a number of patterned dielectric layers and conductive layers that couple to various doped features, circuitry, and input/output of the image sensing device 100. The interconnection layer 114 includes an interlayer dielectric (ILD) and a multilayer interconnection (MLI) structure. The structure includes contacts, vias and metal lines. For the purpose of illustration, a number of conductive lines 116 and vias/contacts 118 are shown in FIG. 1, it being understood that the conductive lines 116 and vias/contacts 118 are merely exemplary. The actual positioning and configuration of the conductive lines 116 and vias/contacts 118 may vary depending on design needs and manufacturing concerns.

A buffer layer 120 is disposed on the interconnection layer 114, in accordance with some embodiments. The buffer layer 120 may include a dielectric material such as silicon oxide. Alternatively, the buffer layer 120 may include silicon nitride.

A carrier substrate 122 is disposed over the buffer layer 120. In some embodiments, the carrier substrate 122 is similar to the semiconductor substrate 102 and includes a silicon material. Alternatively, the carrier substrate 122 may include a glass substrate or another suitable material. The buffer layer 120 provides electrical isolation between the semiconductor substrate 102 and the carrier substrate 122. The carrier substrate 122 provides protection for the various features disposed on the front surface 104 of the semiconductor substrate 102. The carrier substrate 122 also provides mechanical strength and support for processing the back surface 106 of the semiconductor substrate 102 as discussed below.

Common image sensing device defects include optical cross-talk, electrical cross-talk and dark current. The defects become more serious as the image pixel sizes and the spacing between neighboring image pixels continues to shrink. Optical cross-talk refers to photon interference from neighboring pixels that degrades the light-sensing reliability and accuracy of the pixels. Dark current may be defined as the existence of pixel current when no actual illumination is present. In other words, the dark current is the current that flows through the photodiode when no photons are entering the photodiode. White pixels occur where an excessive amount of current leakage causes an abnormally high signal from the pixels. In the image sensing device 100 shown in FIG. 1, the doped isolation regions 110 have a doping polarity opposite to that of the radiation-sensing regions 108 to reduce the dark current and white pixel defects.

Isolation structures 130 are disposed in the semiconductor substrate 102 and extend from the back surface 106. The isolation structures 130 includes a first dielectric layer 141, a second dielectric layer 142, an etch stop layer 143 and dielectric material 128. In some embodiments, the first dielectric layer 141 includes hafnium oxide (e.g. HfO$_2$), and the second dielectric layer 142 includes tantalum pentoxide (e.g. Ta$_2$O$_5$). In other embodiments, the first dielectric layer 141 and/or the second dielectric layer 142 may include other high-k metal oxide such as hafnium oxide, aluminum oxide, zirconium oxide, magnesium oxide, calcium oxide; yttrium oxide, tantalum oxide, strontium oxide, titanium oxide, lanthanum oxide, barium oxide or other metal oxides that can form a high-k film using existing semiconductor deposition technologies. In some embodiments, the thickness of the first dielectric layer 141 is 50 Å, and the thickness of the second dielectric layer 142 is 500 Å. In other embodiments, the thickness of the first dielectric layer 141 is in a range substantially from 10 Å to 100 Å, and the thickness of the second dielectric layer 142 is in a range substantially from 10 Å to 1000 Å.

The etch stop layer 143 may include aluminum oxide (e.g. Al$_2$O$_3$) or titanium dioxide (e.g. TiO$_2$). The thickness of the etch stop layer 142 is in a range substantially from 60 Å to 200 Å. A band gap of the etch stop layer 142 is in a range substantially from 3.5 electron volt (eV) to 10 eV. For example, the band gap of $Al_2O_3$ is essentially 8.9 eV, and the band gap of $TiO_2$ is essentially 3.5 eV, The high band gap reduces the dark current defect. The etch stop layer 143 may include negative charges which increase hole accumulation at an interface of the etch stop layer 143 and creates a depletion region at or close to the interface of the etch stop layer 143 and doped isolation regions (i.e., p-type) 110 of the semiconductor substrate 102 around the radiation-sensing regions 108. The depletion region reduces dark current and/or white pixels. The cumulated negative charge may be around 5E9 to around 1E14 per $cm^2$, or greater than $1E10/cm^2$. In other words, the total charge (Qtot) for the layer is around −5E9 to around −1E14 per $cm^2$, or more negative than $1E10/cm^2$.

The first dielectric layer 141, the second dielectric layer 142 and the etch stop layer 143 are collectively referred to a high-k layer 126. From another aspect, the first dielectric layer 141 is disposed between the etch stop layer 143 and the semiconductor substrate 102, and the second dielectric layer 142 is disposed between the etch stop layer 143 and the first dielectric layer 141.

In some embodiments, the dielectric material 128 includes tungsten compound. In other embodiments, the dielectric material 128 may include silicon oxide, silicon nitride, silicon oxynitride, spin on glass (SOG), low-k dielectric, or another suitable dielectric material.

A buffer layer 129 is disposed over the dielectric material 128. The buffer layer 129 is a silicon oxide film, in accordance with some embodiments. An etch selectivity of the buffer layer 129 to the etch stop layer 143 is greater than a predetermined value with respect to an etch process. In some embodiments, the predetermined value is greater than 80. In some embodiments, the predetermined value is greater than 100. In other words, the etch rate of the buffer layer 129 is 80 or 100 times greater than that of the etch stop layer 143 with respect to the etch process which may be chemical mechanical polishing (CMP) process. In some embodiments, the buffer layer 129 is coplanar with the etch stop layer 143.

Reflective pieces 132 are disposed over the semiconductor substrate 102, in accordance with some embodiments. For example, the reflective pieces 132 are disposed on the isolation structure 130. Each reflective piece 132 is aligned with one of the respective deep-trench isolation structures 130. In some embodiments, the reflective piece 132 includes metal material, such as aluminum, tungsten, copper, tantalum, titanium, alloys thereof, or combinations thereof. Each reflective piece 132 may have a rectangular shape, a reverse trapezoidal shape, reverse triangle shape, or another suitable shape. In some embodiments, each reflective piece 132 has a thickness ranging from 100 Å to 15000 Å.

In some embodiments, the reflective pieces 132 cover the deep-trench isolation structures 130. Therefore, the reflective piece 132 prevents the nearly vertical incident radiation from travelling into the deep-trench isolation structures 130. The nearly vertical incident radiation that travels into the deep-trench isolation structures 130 may be refracted to adjacent radiation-sensing regions 108, and undesired photo cross-talk would occur.

A color filter 136 is disposed over the high-k layer 126, in accordance with some embodiments. The color filter 136 supports the filtering of incident radiation having a particular range of wavelengths, which may correspond to a particular color of light, for example, red, green, or blue. The color filter 136 may be used to allow only light having a predetermined color to reach of the radiation-sensing regions 108.

A micro lens layer 138 may be disposed over the color filter 136 for directing incident radiation toward the radiation-sensing regions 108. The micro lens layer 138 may be positioned in various arrangements and have various shapes depending on the refractive index of the material used for the micro lens layer 138 and/or the distance between the micro lens layer 138 and the radiation-sensing regions 108.

In some embodiments, the color filter 136 is in direct contact with the etch stop layer 143 (i.e. no buffer layer 129 is disposed between the color filter 136 and the etch stop layer 143). Therefore, the optical path of the incident radiation to the radiation-sensing regions 108 is thin-downed. Accordingly, the quantum efficiency (QE) of the image sensing device 100 is improved, and in some applications, the phase detection auto focus (PDAF) angular selectivity is improved.

FIGS. 2A to 2I are diagrammatic fragmentary cross-sectional views of an image sensing device at various stages of fabrication, in accordance with some embodiments. It is understood that FIGS. 2A to 2I have been simplified for a better understanding of embodiments of the present disclosure.

Figure 2A:
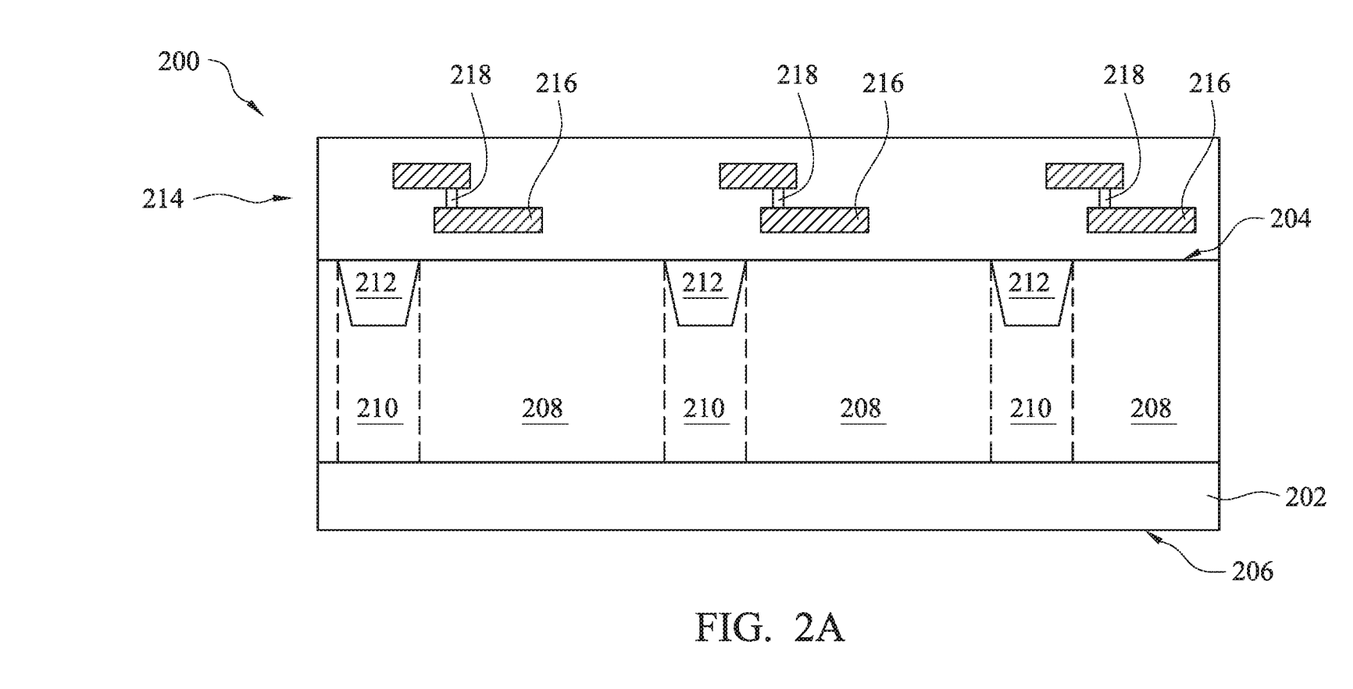
FIG. 2A through FIG. 2I are schematic cross-sectional views of intermediate stages showing a method for manufacturing a semiconductor device in accordance with various embodiments.

Referring to FIG. 2A, an image sensing device 200 includes a semiconductor substrate 202. The semiconductor substrate 202 is a device substrate. The semiconductor substrate 202 may be a silicon substrate doped with a P-type dopant such as boron, in which case the semiconductor substrate 202 is a P-type substrate. Alternatively, the semiconductor substrate 202 could be another suitable semiconductor material. For example, the semiconductor substrate 202 may be a silicon substrate doped with an N-type dopant such as phosphorous or arsenic, in which case the substrate is an N-type substrate. The semiconductor substrate 202 may include other elementary semiconductor materials such as germanium or diamond. The semiconductor substrate 202 may optionally include a compound substrate and/or an alloy semiconductor. Further, the semiconductor substrate 202 may include an epitaxial layer (epi layer), may be strained for performance enhancement, and may include a silicon-on-insulator (SOI) structure.

The semiconductor substrate 202 has a front surface 204 (also referred to as a frontside) and a back surface 206 (also referred to as a backside). For a BSI image sensor device such as the image sensing device 200, incident radiation enters the semiconductor substrate 202 through the back surface 206. In some embodiments, the semiconductor substrate 202 has a thickness ranging from 500 micrometers to about 1000 micrometers. The semiconductor substrate 202 is fabricated with front end processes, in accordance with some embodiments. For example, the semiconductor substrate 202 includes various regions, which may include a pixel region, a periphery region, a bonding pad region, and a scribe line region. For the sake of simplicity, only a portion of the pixel region is shown in FIGS. 2A to 2I.

The pixel region includes radiation-sensing regions 208 and doped isolation regions 210. The radiation-sensing regions 208 are doped with a doping polarity opposite from that of the semiconductor substrate 202. The radiation-sensing regions 208 are formed by one or more implantation processes or diffusion processes. The radiation-sensing regions 208 are formed adjacent to or near the front surface 204 of the semiconductor substrate 202. Although only a portion of the pixel region is shown in FIG. 2A, the pixel region may further include pinned layer photodiodes, photodiode gates, reset transistors, source follower transistors, and transfer transistors. For the sake of simplicity, detailed structures of the above features are not shown in figures of the present disclosure.

The radiation-sensing regions 208 are operable to sense incident radiation that enters the pixel region from the back surface 206. The incident radiation may be visual light. Alternatively, the incident radiation may be infrared (IR), ultraviolet (UV), X-ray, microwave, other suitable types of radiation, or a combination thereof.

The doped isolation regions 210 are adjacent to the radiation-sensing regions 208, in accordance with some embodiments. The doped isolation regions 210 are formed adjacent to or near the front surface 204. Each pair of neighboring radiation-sensing regions 208 is separated from one another by one of the respective doped isolation regions 210. The doped isolation regions 210 are doped with a doping polarity the same as that of the semiconductor substrate 202. In some embodiments, the doping concentration of the doped isolation regions 210 is higher than that of the semiconductor substrate 202. For example, the doping concentration of the doped isolation regions 210 may be in a range substantially from 1E16 per $cm^3$ to 1E20 per $cm^3$. The doped isolation regions 210 are formed by one or more implantation processes or diffusion processes.

Isolation features 212 are formed in the doped isolation regions 210, in accordance with some embodiments. The isolation features 212 are formed adjacent to or near the front surface 204 of the semiconductor substrate 202. In some embodiments, the isolation features 212 are used to define predetermined regions of the radiation-sensing regions 208 and doped isolation regions 210. Therefore, the isolation features 212 may be formed before forming the radiation-sensing regions 208 and doped isolation regions 210. In some embodiments, the doped isolation regions 210 are aligned with the isolation features 212.

The isolation features 212 include shallow trench isolation (STI) structures and/or local oxidation of silicon (LOCOS) structures. In some embodiments, some active or passive features, such as MOSFET or junction capacitor, are formed in the radiation-sensing regions 208, according to design needs and manufacturing concerns. The active or passive features in the radiation-sensing regions 208 are surrounded and protected by the isolation features 212. The thickness of the isolation features 212 is greater than that of the active or passive features in the radiation-sensing regions 208. In some embodiments, the thickness of the isolation features 212 is in a range substantially from 200 angstroms to 5000 angstroms.

In some embodiments, the isolation features 212 are formed by forming trenches in the semiconductor substrate 202 from the front surface 204 and filling a dielectric material into the trenches. The dielectric material may include silicon oxide, silicon nitride, silicon oxynitride, a low-k material, or another suitable dielectric material. A chemical mechanical polishing (CMP) process may be performed to planarize the surface of the dielectric material filling the trenches.

An interconnection layer 214 is formed over the front surface 204 of the semiconductor substrate 202. The interconnection layer 214 includes a number of patterned dielectric layers and conductive layers that couple to various doped features, circuitry, and input/output of the image sensing device 200. The interconnection layer 214 includes an interlayer dielectric (ILD) and a multilayer interconnection (MLI) structure. The MLI structure includes contacts, vias and metal lines. For the purpose of illustration, a number of conductive lines 216 and vias/contacts 218 are shown in FIG. 2A, it being understood that the conductive lines 216 and vias/contacts 218 are merely exemplary. The actual positioning and configuration of the conductive lines 216 and vias/contacts 218 may vary depending on design needs and manufacturing concerns.

Figure 2B:
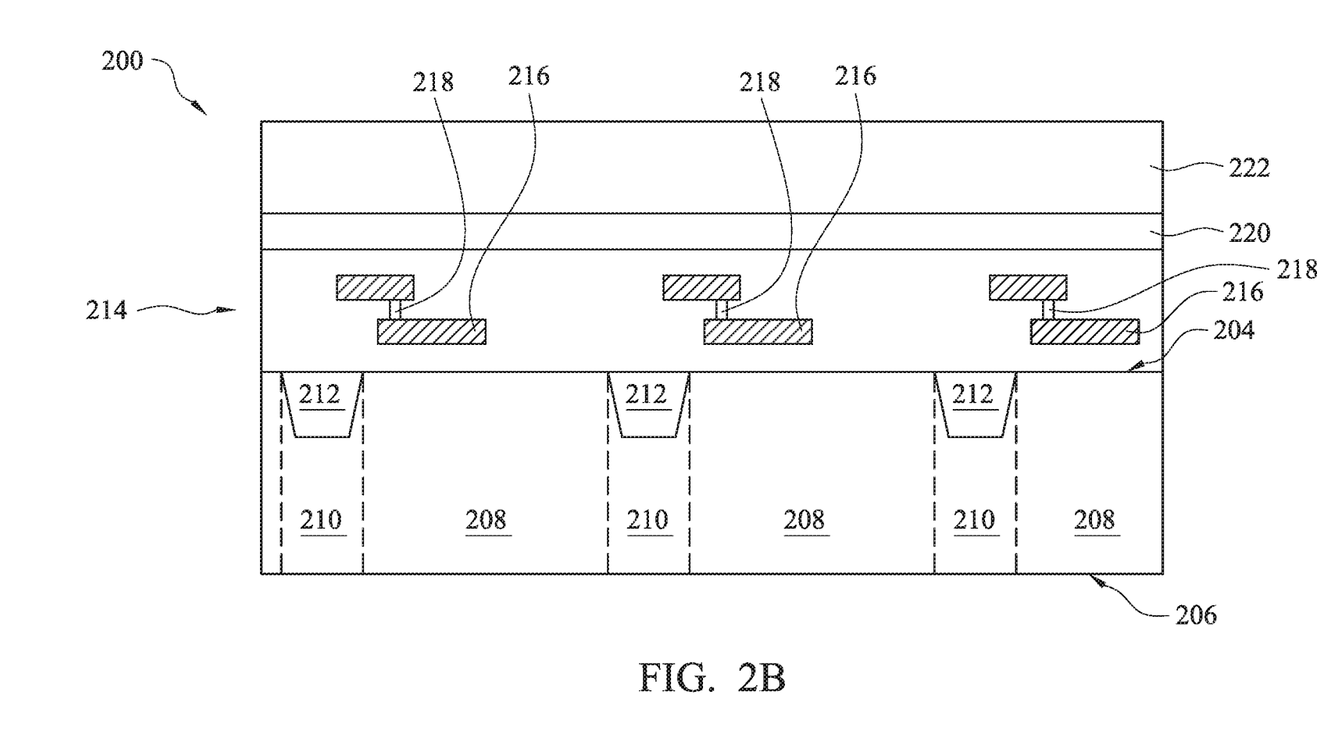

Referring to FIG. 2B, a buffer layer 220 is formed on the interconnection layer 214, in accordance with some embodiments. The buffer layer 220 may include a dielectric material such as silicon oxide. Alternatively, the buffer layer 220 may include silicon nitride. The buffer layer 220 may be deposited by chemical vapor deposition (CVD), physical vapor deposition (PVD), or other suitable techniques. The buffer layer 220 may be planarized to form a smooth surface by a CMP process.

Afterwards, a carrier substrate 222 is bonded with the semiconductor substrate 202 through the buffer layer 220. Therefore, the processing of the back surface 206 of the semiconductor substrate 202 can be performed. In some embodiments, the carrier substrate 222 is similar to the semiconductor substrate 202 and includes a silicon material. Alternatively, the carrier substrate 222 may include a glass substrate or another suitable material. The carrier substrate 222 may be bonded to the semiconductor substrate 202 by molecular forces (direct bonding), optical fusion bonding, metal diffusion bonding, anodic bonding, or by other suitable bonding techniques. The buffer layer 220 provides electrical isolation between the semiconductor substrate 202 and the carrier substrate 222. The carrier substrate 222 provides protection for the various features formed on the front surface 204 of the semiconductor substrate 202. The carrier substrate 222 also provides mechanical strength and support for processing the back surface 206 of the semiconductor substrate 202 as discussed below.

After the carrier substrate 222 is bonded, a thinning process is then performed to thin the semiconductor substrate 202 from the back surface 206. The thinning process may include a mechanical grinding process. Afterwards, an etching chemical may be applied over the back surface 206 of semiconductor substrate 202 to further thin the semiconductor substrate 202 to a thickness which is in the order of a few microns. In some embodiments, the thickness of the semiconductor substrate 202, after being thinned, is in a range substantially from 1 micrometer to 100 micrometers.

Common image sensing device defects include optical cross-talk, electrical cross-talk and dark current. The defects become more serious as the image pixel sizes and the spacing between neighboring image pixels continues to shrink. Optical cross-talk refers to photon interference from neighboring pixels that degrades the light-sensing reliability and accuracy of the pixels. Dark current may be defined as the existence of pixel current when no actual illumination is present. In other words, the dark current is the current that flows through the photodiode when no photons are entering the photodiode. White pixels occur where an excessive amount of current leakage causes an abnormally high signal from the pixels. In the image sensing device 200 shown in FIG. 2B, the doped isolation regions 210 have a doping polarity opposite to that of the radiation-sensing regions 208 to reduce the dark current and white pixel defects.

Figure 2C:
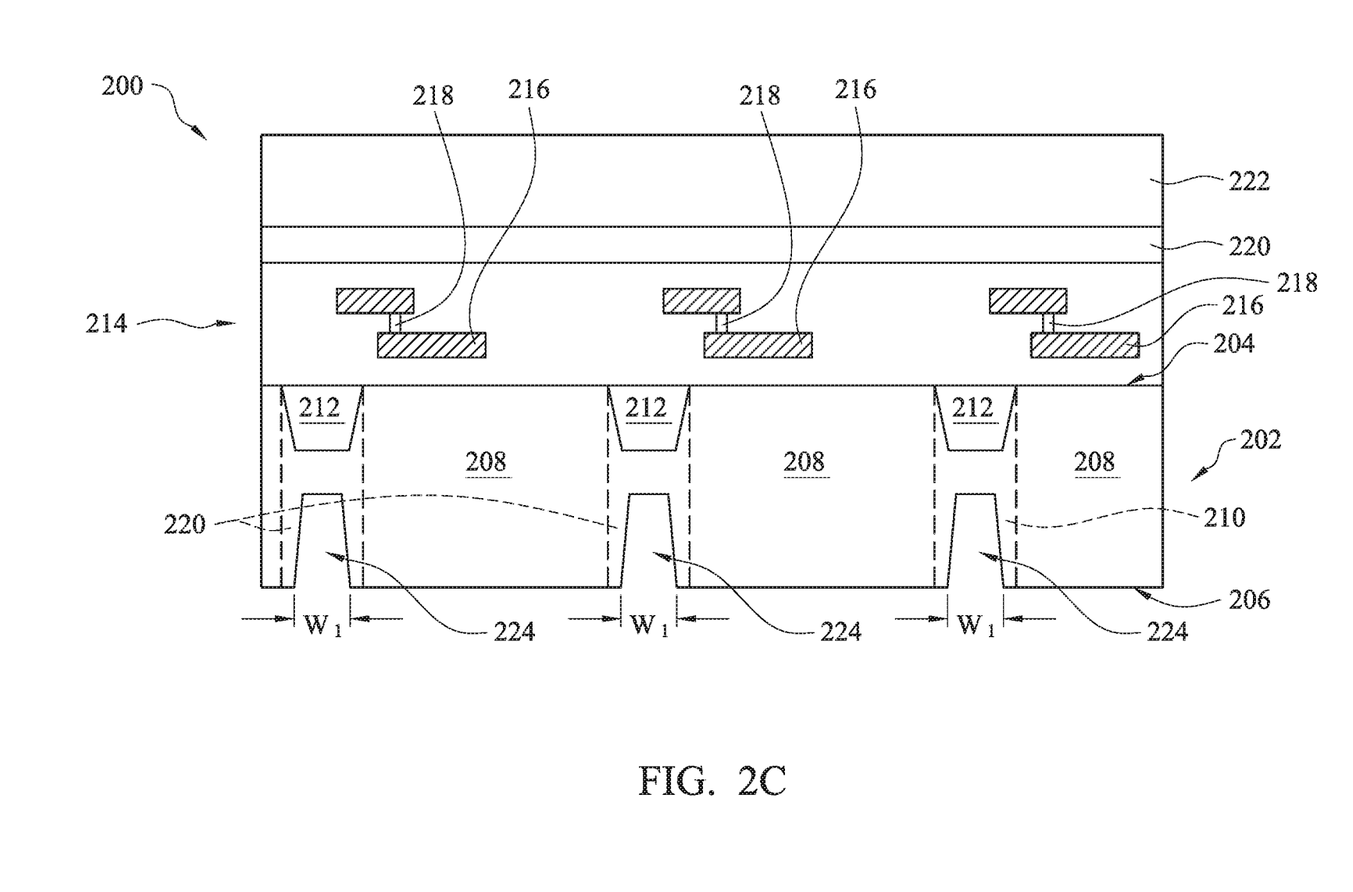

Referring to FIG. 2C, an etching process is performed on the back surface 206 of the semiconductor substrate 202 to form a number of trenches 224 (or openings/recesses), The etching process includes a dry etching process. An etching mask (for example a hard mask, not illustrated herein) may be formed before the etching process is performed. Each of the trenches 224 has a width W1 at the back surface 206 of the semiconductor substrate 202. The width W1 may be smaller than or substantially equal to that of the doped isolation regions 210. The trenches 224 may have a rectangular shape, a trapezoidal shape, or another suitable shape. In some embodiments, each of the trenches 224 extends over half of the thickness of the semiconductor substrate 202 but does not reach the isolation features 212. Accordingly, active or passive features surrounded by the isolation features 212 may be not damaged by the etching process. In some embodiments, the depth of the trenches 224, measured from the back surface 206 of the semiconductor substrate 202, is in a range substantially from 1 micrometer to 10 micrometers. The depth of the trenches 224 may be adjusted by time control without using an etching stop layer. These trenches 224 are used for forming deep-trench isolation (DTI) structures, which will be discussed in more detail below.

Figure 2D:
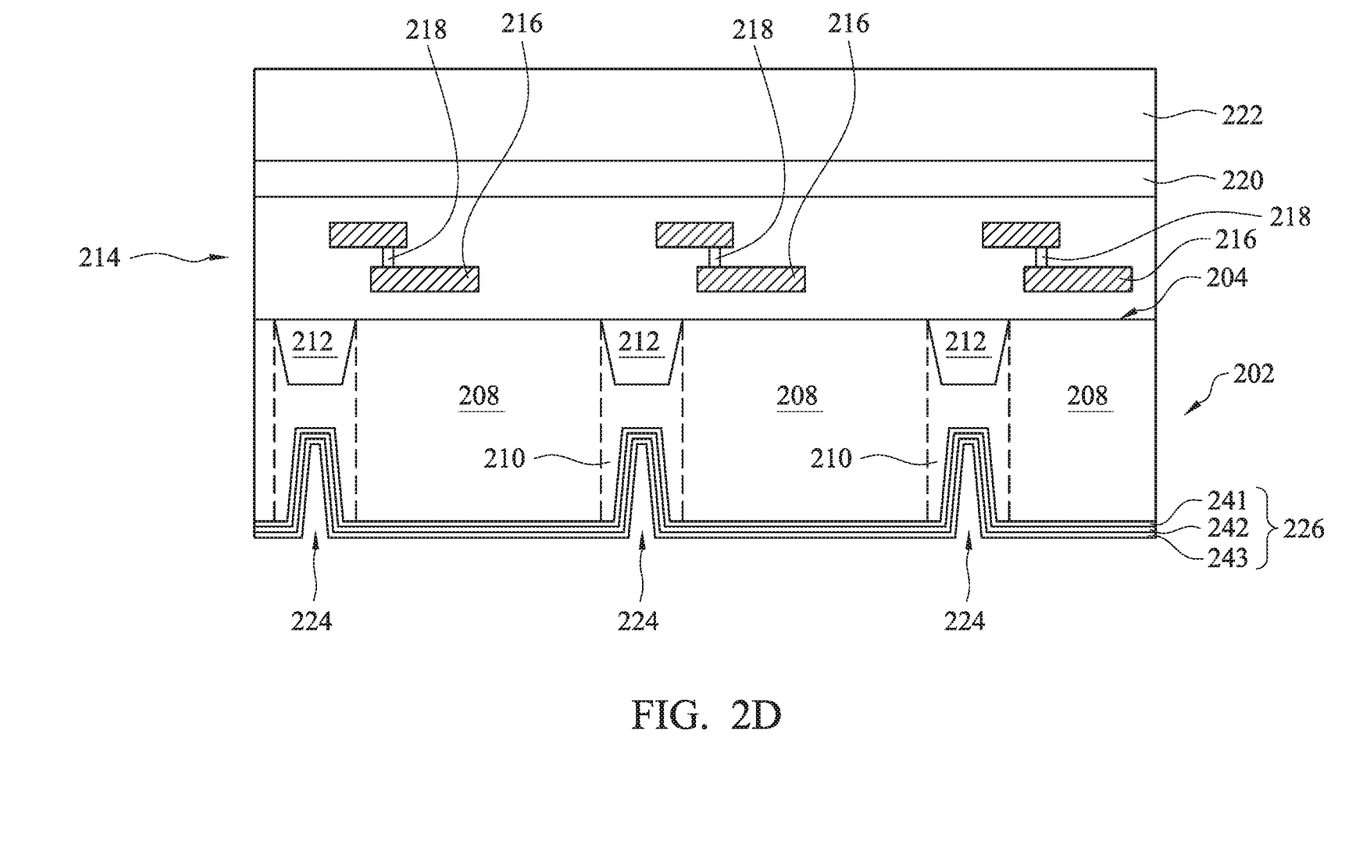

Referring to FIG. 2D, a first dielectric layer 241 is formed over the back surface 206 of the semiconductor substrate 202, in accordance with some embodiments. The first dielectric layer 241 may conformally cover the back surface 206, including covering interior surfaces of the trenches 224 in a conformal manner. A second dielectric layer 242 is formed over the first dielectric layer 241. In some embodiments, the first dielectric layer 241 includes hafnium oxide (e.g. $HfO_2$), and the second dielectric layer 242 includes tantalum pentoxide (e.g. $Ta_2O_5$). In other embodiments, the first dielectric layer 241 and/or the second dielectric layer 242 may include other high-k metal oxide such as hafnium oxide, aluminum oxide, zirconium oxide, magnesium oxide, calcium oxide, yttrium oxide, tantalum oxide, strontium oxide, titanium oxide, lanthanum oxide, barium oxide or other metal oxides that can form a high-k film using existing semiconductor deposition technologies. In some embodiments, the thickness of the first dielectric layer 241 is 50 Å, and the thickness of the second dielectric layer 242 is 500 Å. In other embodiments, the thickness of the first dielectric layer 241 is in a range substantially from 10 Å to 100 Å, and the thickness of the second dielectric layer 242 is in a range substantially from 10 Å to 1000 Å. The first dielectric layer 241 and/or the second dielectric layer 242 may be deposited using a CVD process or a PVD process. The CVD process may be plasma enhanced chemical vapor deposition (PECVD) including ICPECVD, a low pressure chemical vapor deposition (LPCVD), or an atomic layer deposition (ALD) with or without plasma.

An etch stop layer 243 is formed over the second dielectric layer 242. The etch stop layer 243 is formed along the trenches 224, and extends outside of the trenches 224, in accordance with some embodiments. The etch stop layer 243 may include aluminum oxide (e.g. $Al_2O_3$) or titanium dioxide (e.g. $TiO_2$). The thickness of the etch stop layer 243 is in a range substantially from 60 Å to 200 Å. A band gap of the etch stop layer 243 is in a range substantially from 3.5 electron volt (eV) to 10 eV. The high band gap reduces the dark current defect. The etch stop layer 243 may be deposited using a CVD process or a PVD process. The CVD process may be plasma enhanced chemical vapor deposition (PECVD) including ICPECVD, a low pressure chemical vapor deposition (LPCVD), or an atomic layer deposition (ALD) with or without plasma. These processes may be tuned to favor an accumulation of negative charge by varying the process parameters including various flow rates and power parameters, and may involve a treatment operation after the film deposition to increase negative charge. The negative charge increases hole accumulation at an interface of the etch stop layer 243 and creates a depletion region at or close to the interface of the etch stop layer 243 and doped isolation regions (i.e., p-type) 210 of the semiconductor substrate 202 around the radiation-sensing regions 208. The depletion region reduces dark current and/or white pixels. The cumulated negative charge may be around 5E9 to around 1E14 per $cm^2$, or greater than 1E10/$cm^2$. In other words, the total charge (Qtot) for the layer is around −5E9 to around −1E14 per $cm^2$, or more negative than 1E10/$cm^2$.

The first dielectric layer 241, the second dielectric layer 242 and the etch stop layer 243 are collectively referred to a high-k layer 226. From another aspect, the first dielectric layer 241 is formed between the etch stop layer 243 and the semiconductor substrate 202, and the second dielectric layer 242 is formed between the etch stop layer 243 and the first dielectric layer 241.

Figure 2E:
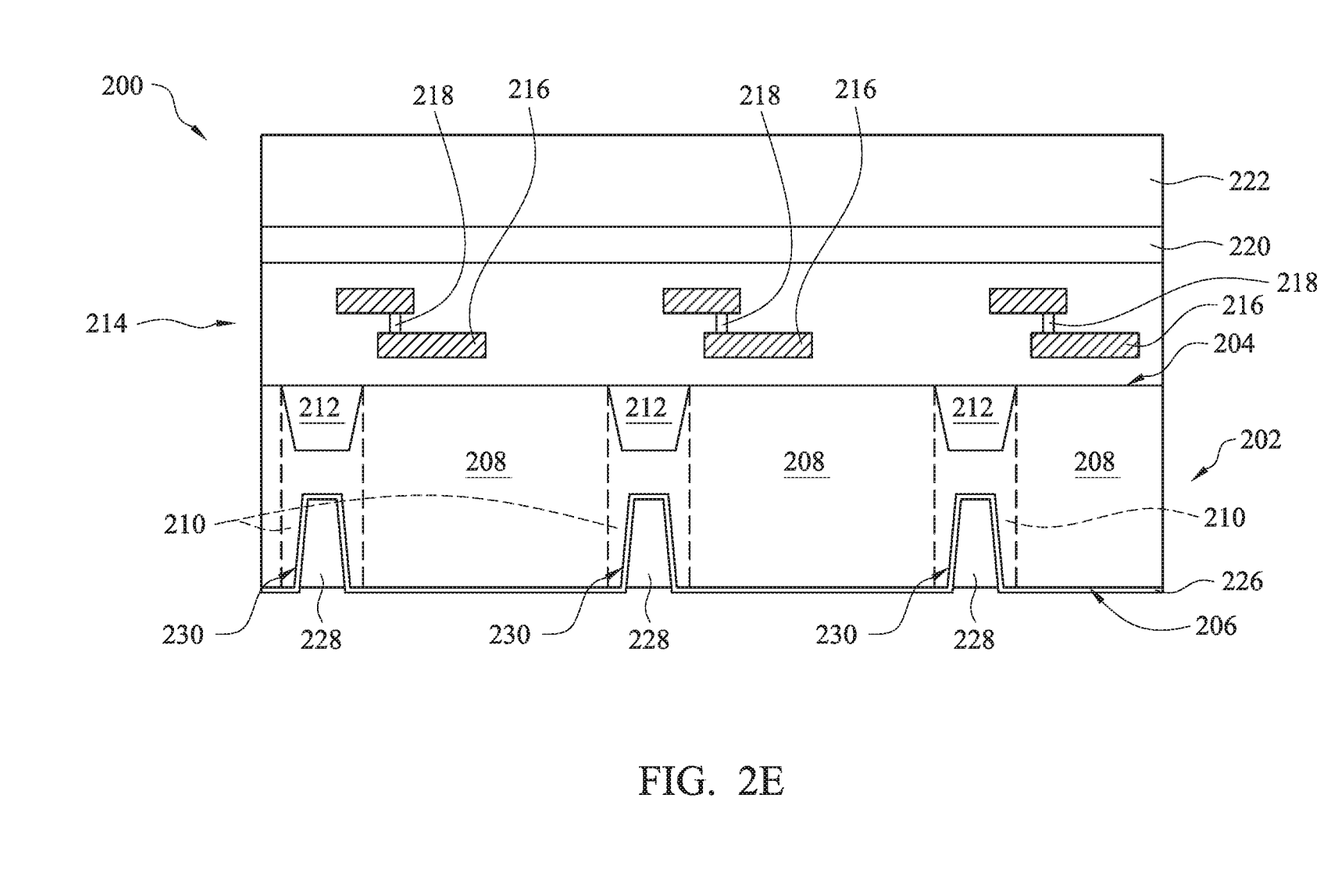

Referring to FIG. 2D and FIG. 2E, dielectric material 228 is deposited over the back surface 206 of the semiconductor substrate 202, in accordance with some embodiments. The dielectric material 228 fills the remaining spaces of the trenches 224. In some embodiments, the dielectric material 228 includes tungsten compound. In other embodiments, the dielectric material 228 may include silicon oxide, silicon nitride, silicon oxynitride, spin on glass (SOG), low-k dielectric, or another suitable dielectric material. The dielectric material 228 may be deposited by CVD, PVD, or another suitable depositing technique. In the following discussion, the trenches 224 and portions of the high-k layer 226 and dielectric material 228 in the trenches 224 are collectively referred to as the deep-trench isolation structures 230.

Figure 2F:
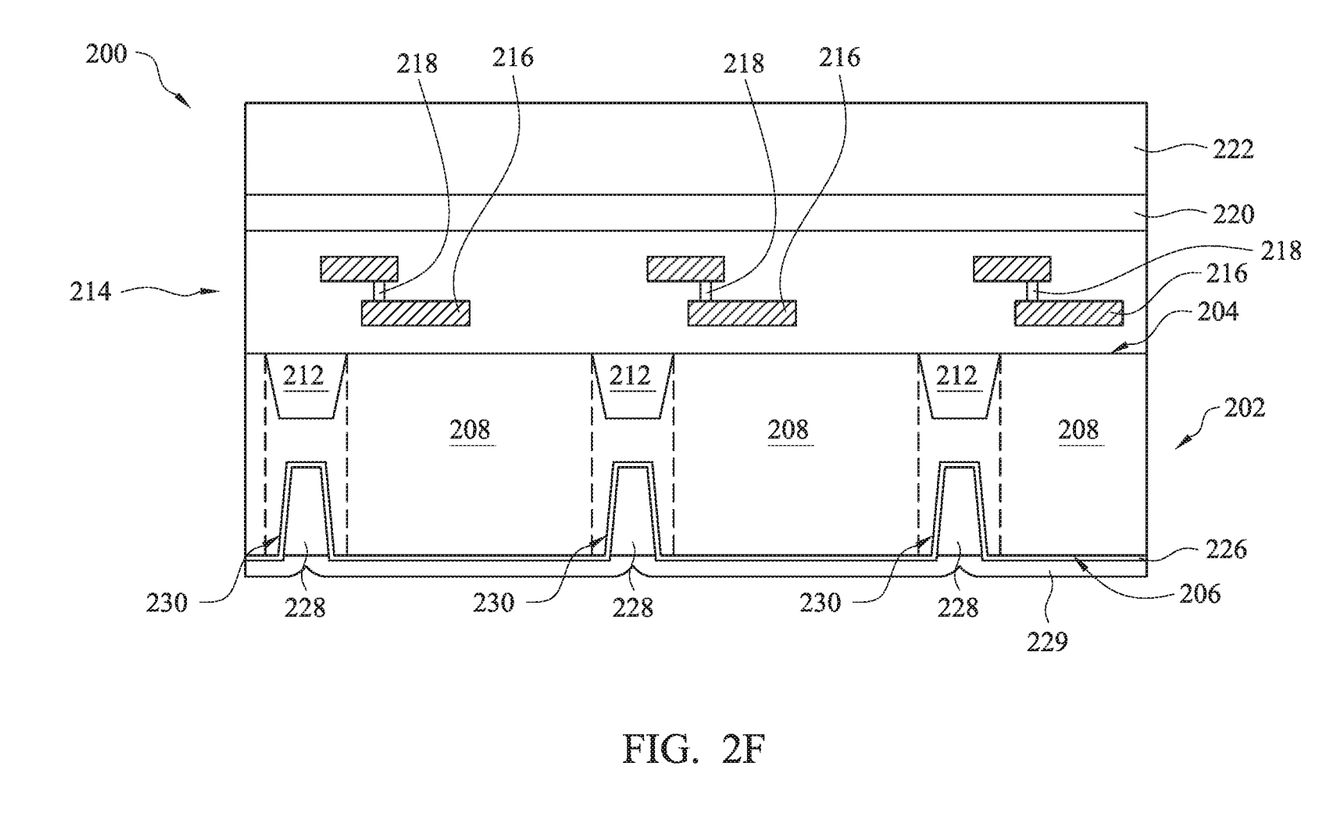
Figure 2G:
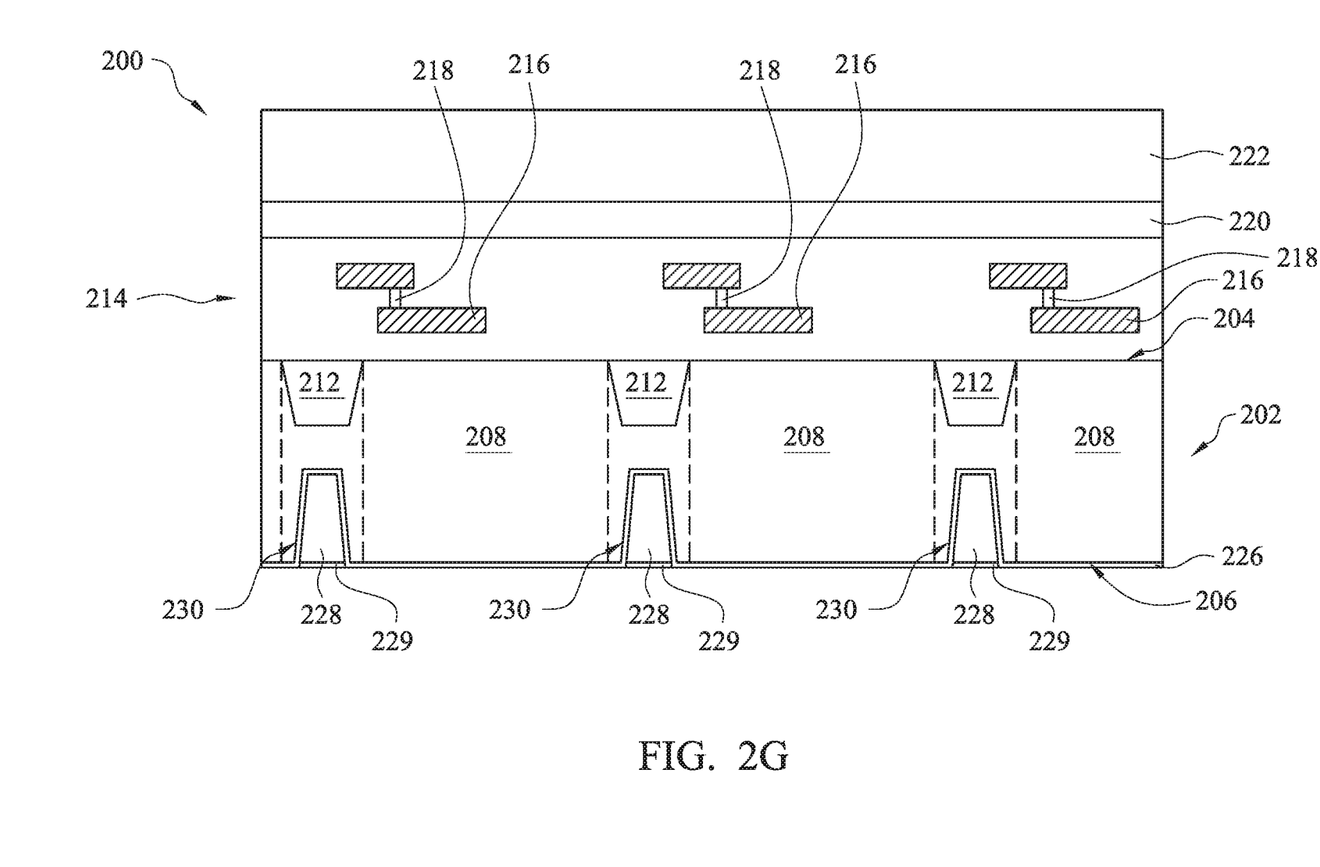

Referring to FIG. 2F, a buffer layer 229 is formed over the high-k layer 226. The buffer layer 229 is a silicon oxide film, in accordance with some embodiments. As shown in FIG. 2F, the buffer layer 229 has poor within wafer (WIW) uniformity due to the trench isolation structures 230. Afterwards, referring to FIG. 2D, FIG. 2F and FIG. 2G, an etch process is performed for etching the buffer layer 229. In particular, an etch selectivity of the buffer layer 229 to the etch stop layer 243 is greater than a predetermined value with respect to the etch process. In some embodiments, the predetermined value is greater than 80. In some embodiments, the predetermined value is greater than 100. In other words, the etch rate of the buffer layer 229 is 80 or 100 times greater than that of the etch stop layer 243 with respect to the etch process which may be chemical mechanical polishing (CMP) process. In some embodiments, the remaining buffer layer 229 exists over the isolation structures 230, but not over the region outside the isolation structures 230 in order to have well within wafer uniformity. In other words, the remaining buffer layer 229 is coplanar with the etch stop layer 243. Due to the high selectivity, the etch stop layer 243 would not be etched much when etching the buffer layer 229, and accordingly the thickness of the etch stop layer 243 may be as low as 60 Å to 200 Å.

Figure 2H:
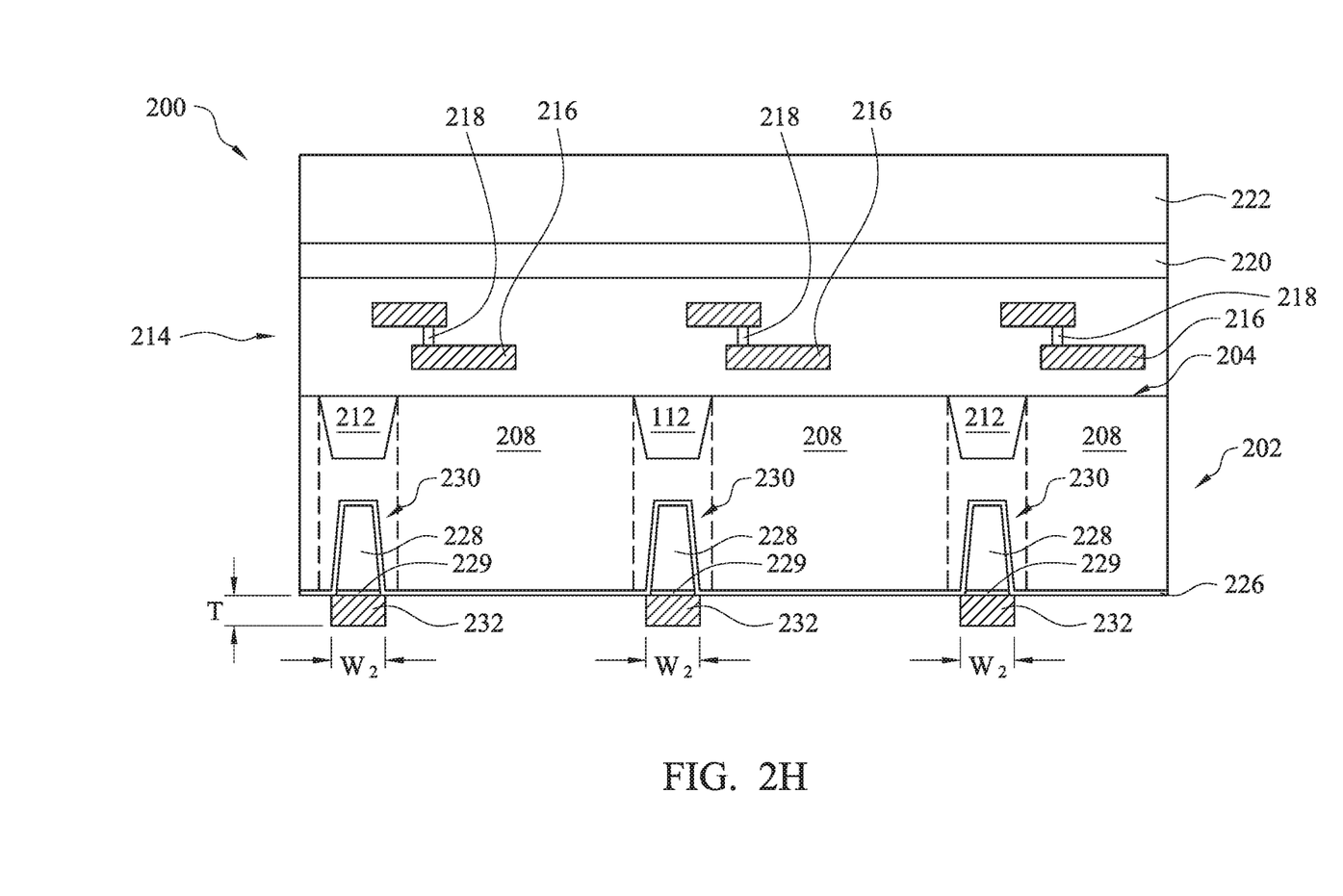

Afterwards, referring to FIG. 2H, reflective pieces 232 are formed over the semiconductor substrate 202, in accordance with some embodiments. For example, the reflective pieces 232 are formed on isolation structure 230. Each reflective piece 232 is aligned with one of the respective deep-trench isolation structures 230. In some embodiments, the reflective piece 232 is formed of a metal material, such as aluminum, tungsten, copper, tantalum, titanium, alloys thereof, or combinations thereof. Each reflective piece 232 may have a rectangular shape, a reverse trapezoidal shape, reverse triangle shape, or another suitable shape. In some embodiments, each reflective piece 232 has a thickness T ranging from 100 Å to 15000 Å. The reflective piece 232 is formed by a suitable deposition process and then patterned. The deposition process includes electroplating, sputtering, CVD, PVD or other suitable depositing techniques. The CVD process may be a PECVD including ICPECVD, an LPCVD, or an ALD with or without plasma.

In some embodiments, the reflective piece 232 has a width W2 at the back surface 206. For example, the width W2 is in a range substantially from 10 nm to 1000 nm. The width W2 is substantially equal to or greater than the width W1 of the deep-trench isolation structures 230 to cover the deep-trench isolation structures 230. Therefore, the reflective piece 232 prevents the nearly vertical incident radiation from travelling into the deep-trench isolation structures 230. The nearly vertical incident radiation that travels into the deep-trench isolation structures 230 may be refracted to adjacent radiation-sensing regions 208, and undesired photo cross-talk would occur.

Figure 2I:
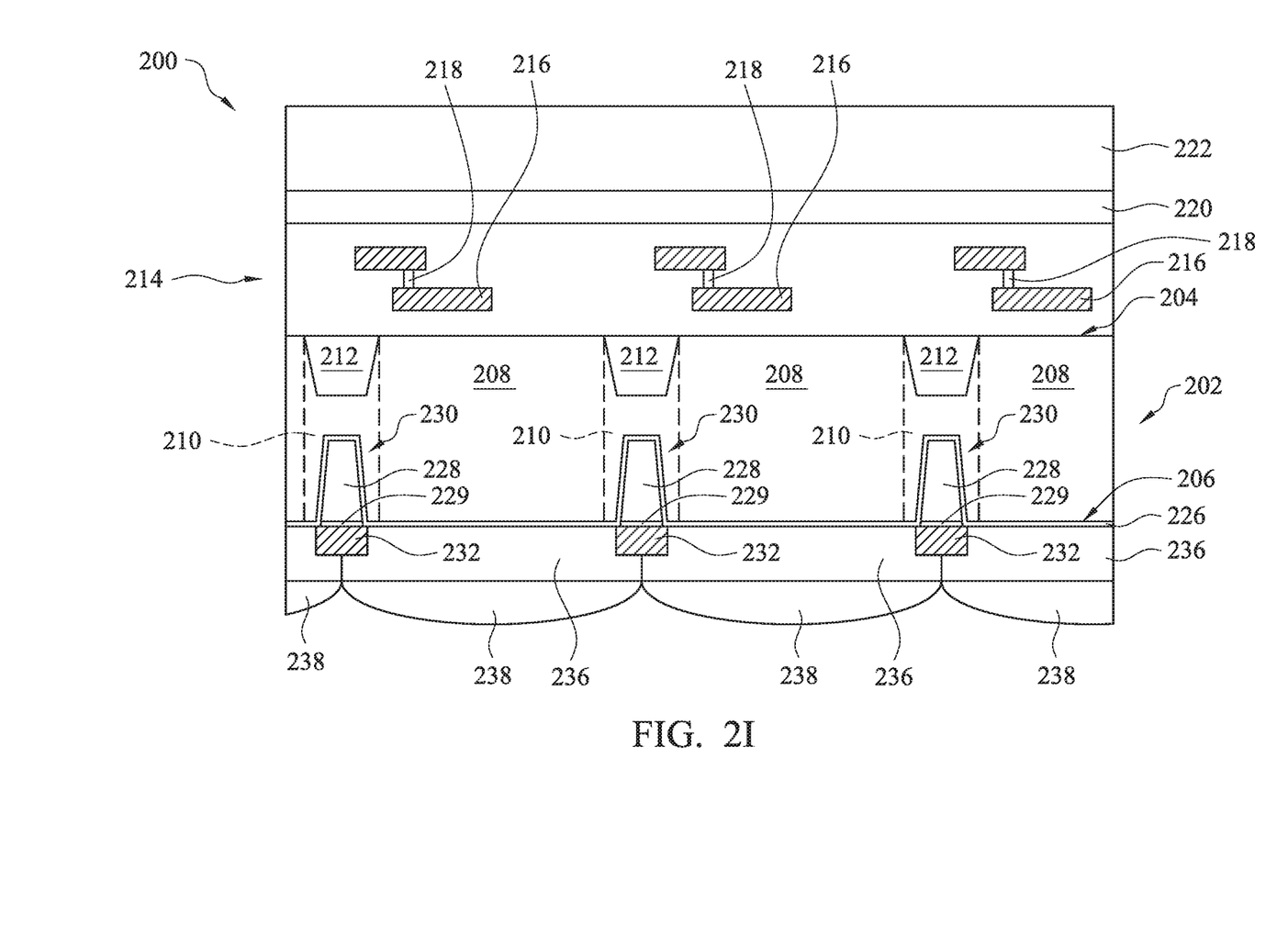

Afterwards, referring to FIG. 2I, a color filter 236 is formed over the high-k layer 226, in accordance with some embodiments. The color filter 236 supports the filtering of incident radiation having a particular range of wavelengths, which may correspond to a particular color of light, for example, red, green, or blue. The color filter 236 may be used to allow only light having a predetermined color to reach of the radiation-sensing regions 208. Afterwards, the micro lens layer 238 may be formed over the color filter 236 for directing incident radiation toward the radiation-sensing regions 208. The micro lens layer 238 may be positioned in various arrangements and have various shapes depending on the refractive index of the material used for the micro lens layer 238 and/or the distance between the micro lens layer 238 and the radiation-sensing regions 208.

Referring to FIG. 2D and FIG. 2I, note that the color filter 236 is in direct contact with the etch stop layer 243, and thus the optical path of the incident radiation to the radiation-sensing regions 208 is thin-downed. Accordingly, the quantum efficiency (QE) of the image sensing device 200 is improved, and in some applications, the phase detection auto focus (PDAF) angular selectivity is improved.

Figure 3A:
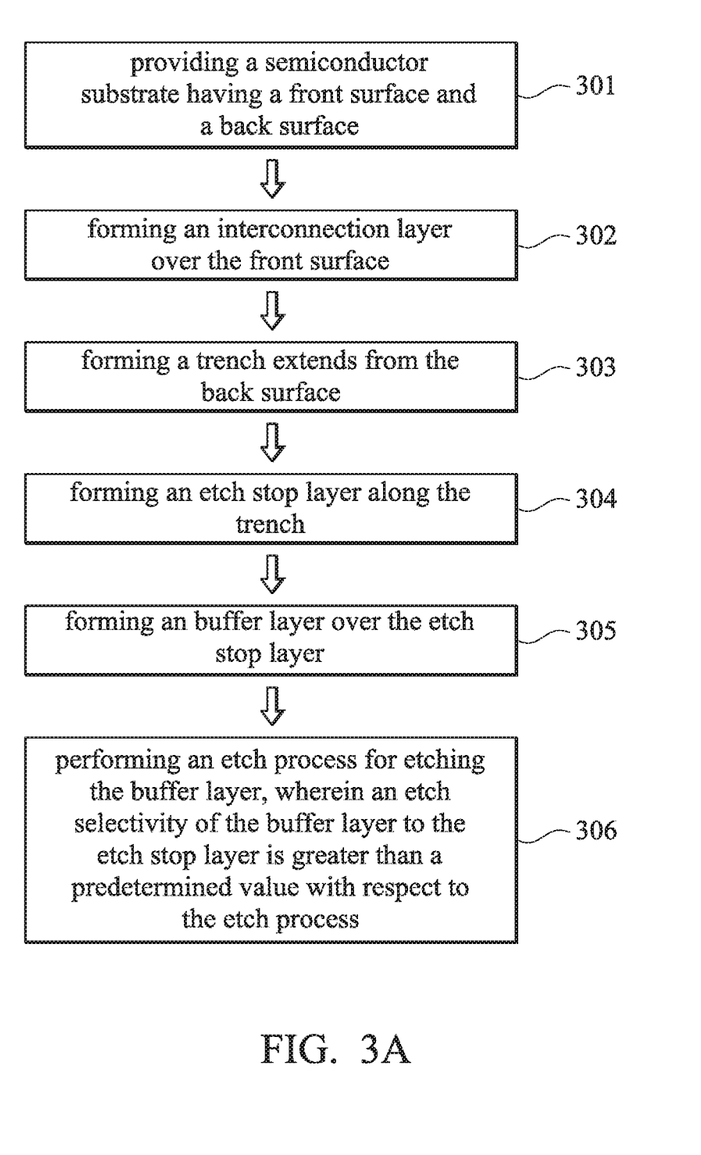
FIG. 3A and FIG. 3B are diagrams illustrating methods for manufacturing an image sensing device in accordance with some embodiments.

FIG. 3A is a diagram illustrating a flowchart of a method for manufacturing an image sensing device according to some embodiments. In operation 301, a semiconductor substrate having a front surface and a back surface is provided. In operation 302, an interconnection layer is formed over the front surface of the semiconductor substrate. In operation 303, a trench extending from the back surface of the semiconductor substrate is formed. In operation 304, an etch stop layer is formed along the trench. In operation 305, a buffer layer is formed over the etch stop layer. In operation 306, an etch process is performed for etching the buffer layer. An etch selectivity of the buffer layer to the etch stop layer is greater than a predetermined value with respect to the etch process. All the operations in FIG. 3A have been described in detail above, and therefore the description will not be repeated. Other operations may be inserted between the operations of the FIG. 3A.

Figure 3B:
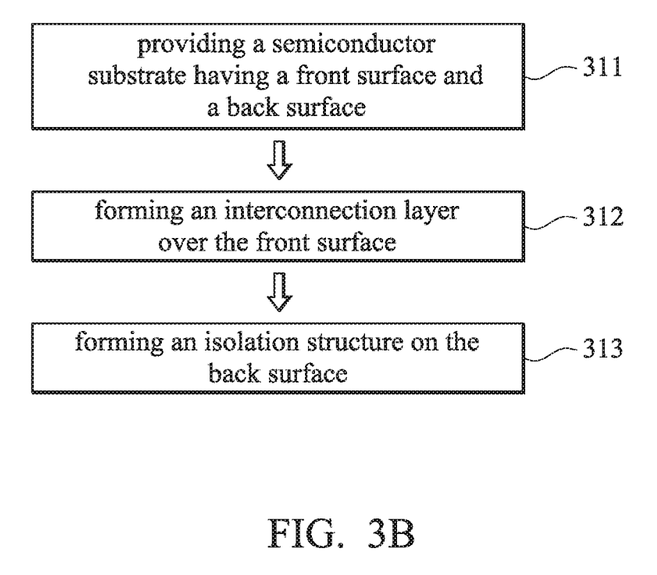

FIG. 3B is a diagram illustrating a flowchart of a method for manufacturing an image sensing device according to some embodiments. In operation 311, a semiconductor substrate having a front surface and a back surface is provided. In operation 312, an interconnection layer is formed over the front surface of the semiconductor substrate. In operation 313, an isolation structure is formed on the back surface. In particular, the isolation structure includes a trench extending from the back surface of the semiconductor and an etch stop layer along the trench. An etch selectivity of a silicon oxide film to the etch stop layer is greater than a predetermined value. All the operations in FIG. 3B have been described in detail above, and therefore the description they will not be repeated. Other operations may be inserted between the operations of the FIG. 3B.

In accordance of the embodiments, an image sensing device is provided. The image sensing device includes a semiconductor substrate, an interconnection layer, a radiation-sensing region and an isolation structure. The semiconductor substrate has a front surface and a back surface. The interconnection layer is disposed over the front surface of the semiconductor substrate. The radiation-sensing region is located in the semiconductor substrate. The isolation structure is disposed on the back surface of the semiconductor substrate. The isolation structure includes a trench and an etch stop layer. The trench extends from the back surface of the semiconductor substrate. The etch stop layer is disposed along the trench. An etch selectivity of a silicon oxide film to the etch stop layer is greater than a predetermined value.

In accordance of the embodiments, a method for manufacturing an image sensing device is provided. A semiconductor substrate having a front surface and a back surface is provided. An interconnection layer is formed over the front surface of the semiconductor substrate. A trench extending from the back surface of the semiconductor substrate is formed. An etch stop layer is formed along the trench. A buffer layer is formed over the etch stop layer. An etch process is performed for etching the buffer layer. An etch selectivity of the buffer layer to the etch stop layer is greater than a predetermined value with respect to the etch process.

In accordance of the embodiments, a method for manufacturing an image sensing device is provided. A semiconductor substrate having a front surface and a back surface is provided. An interconnection layer is disposed over the front surface of the semiconductor substrate. An isolation structure is disposed on the back surface. In particular, the isolation structure includes a trench extending from the back surface of the semiconductor and an etch stop layer along the trench. An etch selectivity of a silicon oxide film to the etch stop layer is greater than a predetermined value.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for manufacturing an image sensing device, the method comprising:
   forming an interconnection layer over a front surface of a semiconductor substrate;
   forming a trench extending from a back surface of the semiconductor substrate;
   forming an etch stop layer along the trench;
   forming an buffer layer over the etch stop layer; and
   performing an etch process for etching the buffer layer, wherein the buffer layer and the etch stop layer comprise different materials.

2. The method of claim 1, wherein an etch selectivity of the buffer layer to the etch stop layer is greater than about 80 with respect to the etch process.

3. The method of claim 1, wherein the buffer layer is a silicon oxide film.

4. The method of claim 1, wherein a band gap of the etch stop layer is in a range substantially from 3.5 electron volt (eV) to 10 eV.

5. The method of claim 1, wherein a thickness of the etch stop layer is in a range substantially from 60 Å to 200 Å.

6. The method of claim 1, wherein the etch stop layer comprises aluminium oxide or titanium dioxide.

7. The method of claim 1, wherein after performing the etch process, the method further comprises:
    forming a color filter on the etch stop layer, wherein the color filter is in direct contact with the etch stop layer.

8. The method of claim 1, wherein before forming the etch stop layer, the method further comprises:
    forming a first dielectric layer over the semiconductor substrate, wherein the first dielectric layer is between the etch stop layer and the semiconductor substrate, and the first dielectric layer comprises hafnium oxide; and
    forming a second dielectric layer over the first dielectric layer, wherein the second dielectric layer is between the etch stop layer and the first dielectric layer, and the second dielectric layer comprises tantalum pentoxide.

9. The method of claim 8, wherein after forming the etch stop layer, the method further comprises:
    forming a dielectric material over the etch stop layer and filling the trench.

10. A method for manufacturing an image sensing device, comprising:
    forming an interconnection layer over a front surface of a semiconductor substrate;
    forming a deep-trench isolation structure on a back surface of the semiconductor substrate, wherein forming the deep-trench isolation structure comprises:
        forming a trench in the semiconductor substrate and extending from the back surface of the semiconductor substrate;
        forming a dielectric layer in the trench; and
        forming an etch stop layer above the trench; and
    forming a color filter above the deep-trench isolation structure and in contact with the etch stop layer.

11. The method of claim 10, wherein a band gap of the etch stop layer is in a range substantially from 3.5 electron volt (eV) to 10 eV.

12. The method of claim 10, wherein the etch stop layer comprises Al or Ti.

13. The method of claim 10, wherein the dielectric layer comprises $HfO_2$.

14. The method of claim 10, wherein the dielectric layer comprises $Ta_2O_5$.

15. A method for manufacturing an image sensing device, the method comprising:
    forming a radiation-sensing region in a semiconductor substrate from a front surface of the semiconductor substrate;
    forming a trench extends from a back surface of the semiconductor substrate;
    forming a first dielectric layer in the trench;
    forming a second dielectric layer in the trench and above the first dielectric layer;
    forming an etch stop layer in the trench and above the second dielectric layer, wherein materials of the first dielectric layer, the second dielectric layer, and the etch stop layer are different; and
    forming a dielectric material in the trench and over the etch stop layer.

16. The method of claim 15, wherein a band gap of the etch stop layer is in a range substantially from 3.5 electron volt (eV) to 10 eV.

17. The method of claim 15, wherein the first and second dielectric layers are high-k dielectric layers.

18. The method of claim 15, further comprising forming a color filter in contact with the etch stop layer.

19. The method of claim 15, further comprising forming a reflective piece directly above the dielectric material and in contact with the etch stop layer.

20. The method of claim 15, wherein the dielectric material comprises tungsten compound.

* * * * *